United States Patent [19]
Um

[11] Patent Number: 6,115,883
[45] Date of Patent: Sep. 12, 2000

[54] CARRYING DEVICE FOR A PORTABLE COMPUTER

[75] Inventor: Kun-Ho Um, Suwon, Rep. of Korea

[73] Assignee: SamSung Electronics Co., Ltd., Suwon, Rep. of Korea

[21] Appl. No.: 08/951,840

[22] Filed: Oct. 17, 1997

[51] Int. Cl.$^7$ .................................................. A47B 95/02

[52] U.S. Cl. ........................... 16/115; 220/756; 361/625; 16/111 R

[58] Field of Search ............................ 16/111 R, 110 R, 16/112, 113, 126, 115, DIG. 41, DIG. 39; 220/756, 757, 762, 763, 764; 361/600, 679, 825, 683, 610, 625, 680, 681

[56] References Cited

U.S. PATENT DOCUMENTS

| | | | |
|---|---|---|---|
| 2,425,636 | 8/1947 | Parkin | 411/551 |
| 2,730,154 | 1/1956 | Aspey | 411/553 X |
| 2,882,580 | 4/1959 | Barsalou | 411/551 |
| 4,196,821 | 4/1980 | Teti, Jr. et al. | 220/756 |
| 4,515,419 | 5/1985 | Hampel et al. | 220/756 X |
| 5,370,488 | 12/1994 | Sykes | 411/551 |

*Primary Examiner*—Anthony Knight
*Assistant Examiner*—David Bochna
*Attorney, Agent, or Firm*—Robert E. Bushnell

[57] ABSTRACT

A multifunctional handle for portable computers that can also serve as a rear port cover, a tilting device, and a lid-locking device. This handle allows for easier transportation of the portable computer over short distances and increased security while eliminating the need for a separate tilting device or port-covers.

16 Claims, 6 Drawing Sheets

CARRYING DEVICE FOR A PORTABLE COMPUTER

CLAIM OF PRIORITY

This application makes reference to, incorporates the same herein, and claims all rights accruing thereto under 35 U.S.C. §119 through my patent application entitled *A Grip Device For a Portable Computer* earlier filed in the Korean Industrial Property Office on Oct. 17, 1996 and there duly assigned Ser. No. 1996/46524.

BACKGROUND OF THE INVENTION

1. Field of the Invention

The present invention relates to a carrying device for a portable electronic apparatus and, more particularly, to a multifunctional handle that can alternatively serve as a rear port cover, a lid locking device, or a tilting device for a portable computer.

2. Background Art

The ease of traveling with portable computers, e.g. laptops, has been one of the factors in their increasing popularity. A portable computer is often constructed with a liquid crystal display hingedly attached to the main body of the computer. The display panel also forms a cover for the keyboard, that is built onto the main body. Various ports are located along the rear side of the main body for attaching various input or output devices. Some laptops have handles to ease the carrying of the computers. Examples of which can be found in U.S. Pat. No. 4,858,162 to Kieffer entitled *Method and Apparatus Used in Mounting Expansion Cards,* U.S. Pat. No. 5,100,098 to Hawkins entitled *Stand and Handle for Hand Held Computer,* U.S. Pat. No. 5,235,495 to Blair entitled *Pen-Based Computer With Handle/Prop Having Ratchet Locking Mechanism,* U.S. Pat. No. 5,396,399 to Blair entitled *Multi-Purpose Handle/Prop for Pen-based Computer Having Overhanging Front Surface,* and U.S. Pat. No. 5,642,258 to Barrus entitled *Computer Accessory Including a Pivotally Mounted Combined Handle and Power Source and Associated Methods of Manufacturing.*

I find it surprising that so few laptops used today actually incorporate handles. Instead users opt to carry the computers by hand or in bags while traveling. Accidents can occur from carrying the computer with only one hand when one's grip slips, while many people find that using two hands to carry a laptop is too inconvenient. As such, I expect that a multifunctional handle would simplify the transport of laptops. Moreover, a handle that can alternatively serve as a tilting device, a port cover, or a lid locking device would eliminate the need for a separate device to adjust the operating angle of the portable computer and also eliminate the need for a lid locking device to prevent unauthorized users from accessing the computer.

SUMMARY OF THE INVENTION

Accordingly, it is an object of the present invention to provide an improved handle for a portable computer.

It is another object to provide a handle for a portable computer that can alternatively serve as a rear port cover.

It is still another object to provide a handle for a portable computer that can alternatively serve as a lid locking device.

It is yet another object to provide a handle for a portable computer that can alternatively serve as a tilting device to raise the rear of the computer.

To achieve these and other objects a multifunctional handle is provided that has a guide slot on each of the two portions of the handle that pivotally connect to the computer (hereinafter referred to as radial members). These guide slots have a plurality of grooves formed along the outside periphery of the guide slot. These slots allow a fastener to fixedly mate with the guide slot in a plurality of discrete positions. The fastener is inserted through the guide slot in a radial member to secure the handle on the sides of the main body. The fastener may be constructed using a shaft that has a threaded middle portion and a knob positioned at one end of the shaft. Between the knob and the shaft is a flange that mates with one pair of the plurality of grooves in the radial members. The grooves are of semicircular shape and aligned along opposite sides of the guide slot at a spacing that depends on the size of the flange. This construction allows the handle to move along the sides of the main body so that the portion of the handle most parallel to the axis of rotation of the radial members (hereinafter referred to as the circumferential member) can move closer to the axis of rotation as well as pivot around it. Once the handle is in the desired position the fasteners are tightened. This causes the radial members to be compressed toward the main body and securedly held.

The fastener may also be constructed using a compression flange and a plurality of protrusions positioned on the shaft at an end opposite from the knob. The flange attached to the shaft is matable with one pair of the grooves located on the outer periphery of a guide slot on a radial member. After the flange is engaged with a groove the knob is tightened to secure the handle to the body. The plurality of protrusions fit into guide slots correspondingly aligned around the threaded hole in the main body. As such, the protrusions are first inserted into the main body through the guide slots that are positioned around the threaded hole and into the interior of the main body, then the fastener is turned so that the threads on the fastener engage the threaded hole. Thus, to secure the handle in place the projections on the fastener must be inserted through the guide slot and then through the guide holes in the main body and then the knob must be rotated to compress the radial arms against the main body of the portable computer.

Preferably, the multifunctional handle has a grip section located in the middle of the circumferential member. When the handle is in its fully retracted position it covers the ports and I/O connectors located at the rear side of the main body. The handle can also be adjusted to lock the lid in a closed position or to function as a tilting device for the portable computer.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
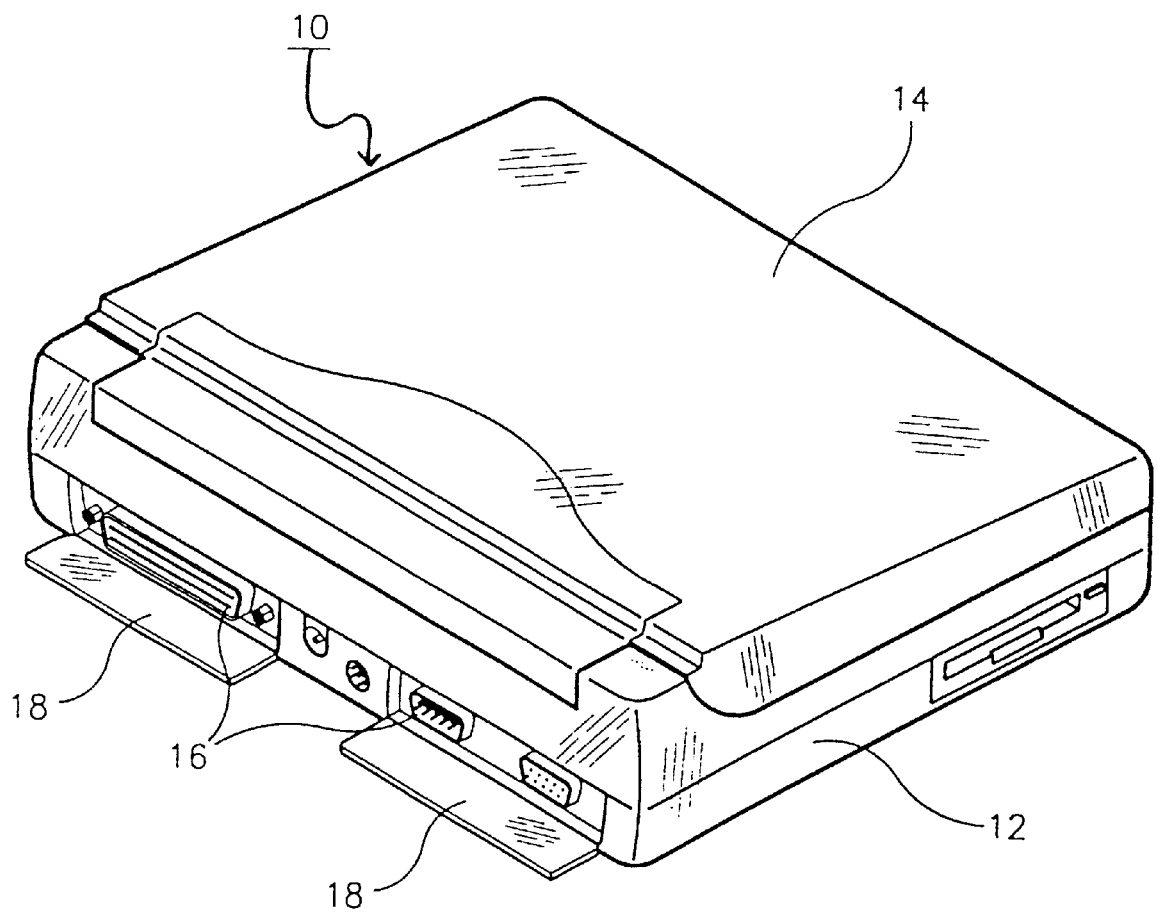
FIG. 1 is a perspective view of the rear side of a portable computer.

Turning now to the drawings, FIG. 1 illustrates a portable computer that has liquid crystal display 14 hingedly attached to main body 12 of portable computer 10. Display panel 14 also functions as a keyboard (not shown) cover. Along the rear side of the portable computer various connectors or ports 16 are located that enable computer 10 to connect with auxiliary input and output devices and printers. Some computers have covers for these ports.

This type of portable computer can be inconvenient to transport over short distances because of the time necessary to pack the computer into a special bag before carrying the computer. Even on short trips carrying a computer by hand is not preferable because of the potentially fatal damage that can occur if the computer is dropped. Portable computers are heavy enough to make carrying them with one hand inadvisable and also small enough that carrying them with two hands is inconvenient. Furthermore, the laptop in FIG. 1 requires a separate tilting device to adjust and to hold the keyboard at an angle that is more convenient and natural for manipulation by the user. The portable computer also needs a separate lid-locking device to prevent the display panel from being easily opened by unauthorized users because the latch that is built in is an easy one-touch operated locking device.

Figure 2:
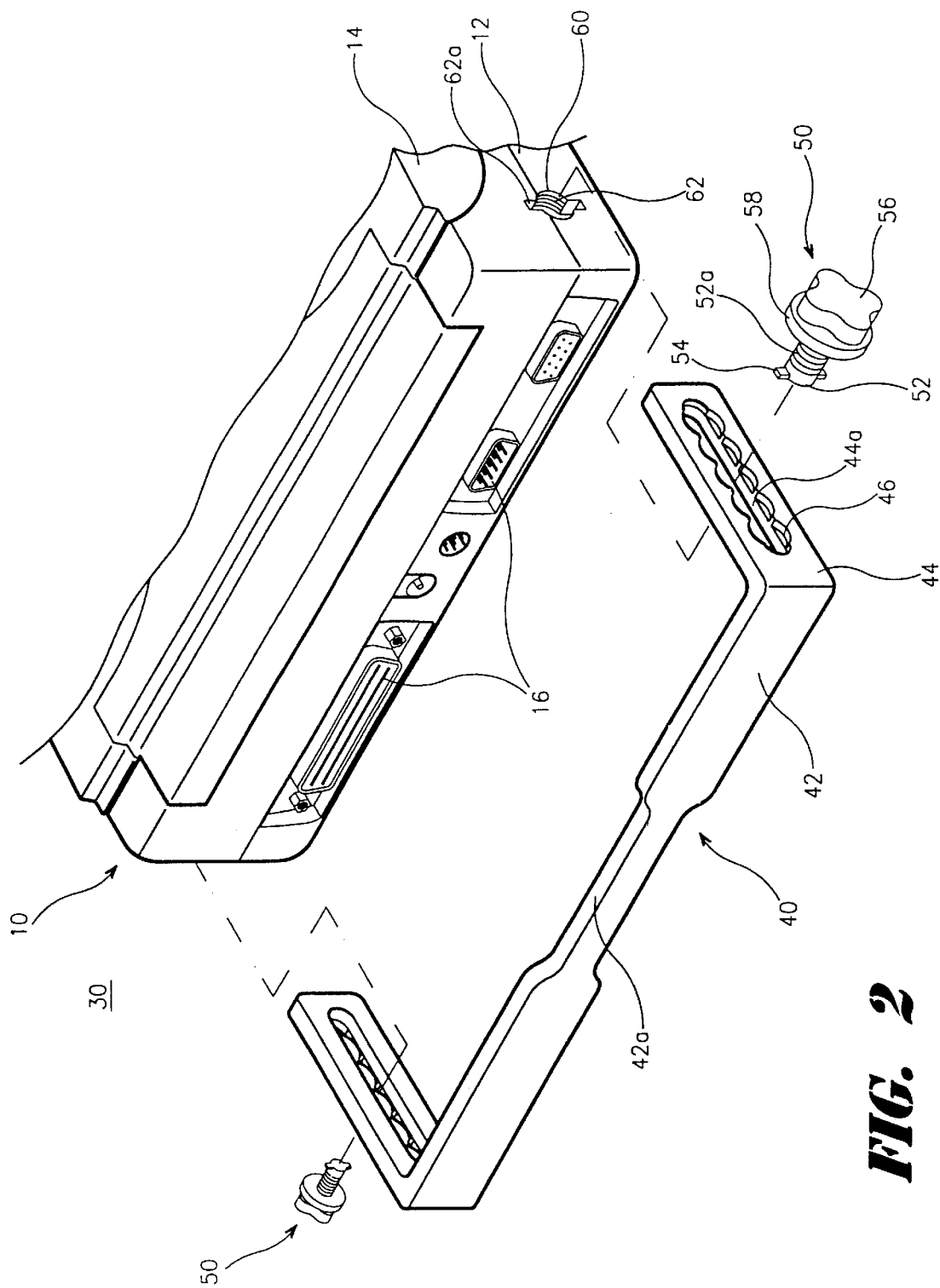
FIG. 2 is an exploded, partially enlarged, perspective view of the salient components of a multifunctional handle constructed as a first embodiment according to the principles of the present invention.

The preferred embodiment of a multifunctional handle constructed according to the principles of the present invention is shown in FIG. 2. Multifunctional handle 40 may be constructed with flat circumferential member 42 and a radial member 44 located at each end of circumferential member 42. In the middle of circumferential member 42 there is a grip 42a to increase comfort while carrying the computer. The multifunctional handle is secured to the main body using fastener 50 inserted through guide slot 44a to secure radial member 44 to the main body of the computer. Each radial member 44 has a guide slot in it to allow the handle to slide along the sides of the portable computer. This allows the circumferential member to be moved towards or away from the axis of rotation of the radial members. A plurality of grooves 46 are positioned on the outer periphery of guide slots 44a. Grooves 46 are semicircular in shape and spaced apart depending on the size of flange 58 that is attached to fastener 50.

Fastener 50 may be constructed with a bolt shaped body that has a shaft 52, a compression flange 58, and a knob 56. Shaft 52 has a middle portion 52a that is threaded. Compression flange 58 and knob 56 are integrally formed on one end of shaft 52 and a plurality of protrusions are formed on the circumference of the shaft at the opposite end from the knob. Protrusions 54 can be linearly aligned along a common diameter of shaft 52 or in any other configuration that will still allow protrusions 54 to fit through guid slot 44a. Furthermore, the periphery of knob 56 is knurled to make gripping easier. In FIG. 2, fastener 50 on the right hand side is shown enlarged relative to the rest of the figure for the purpose of illustration. Threaded hole 62 is located near a distal end of each side of main body 12 to engage fastener 50. Portable computer 10 also has LCD panel 14 hingedly attached on the upper side of main body 12, and I/O ports and connectors 16 located on the rear side of the main body.

Figure 3:
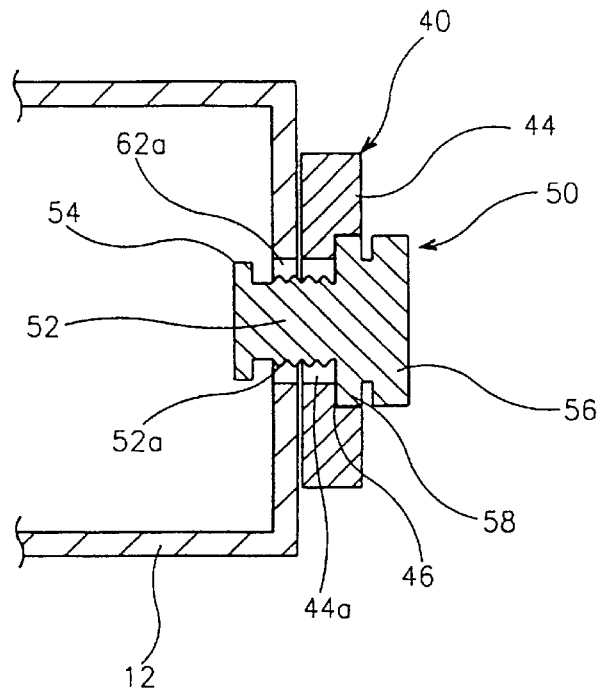
FIG. 3 is a sectional view of a radial member of the handle secured to the main body by a fastener.

Threaded hole 62 has guide slots 62a for receiving protrusions 54. As shown in FIG. 3, handle 40 is attached to main body 12 of the portable computer by fastener 50. To attach handle 40 to mainbody 12, protrusions 54 on shaft 52 are inserted through guide slot 44a in radial member 44 and through guide slots 62a on the threaded hole 62 into main body 12. Then, threaded portion 52a of shaft 52 is engaged with threaded hole 62 by rotating knob 56. As shaft 52 is rotated radial member 44 is compressed toward main body 12. Flange 58 of knob 56 is fitted into one pair of oppositely aligned grooves 46 and as knob 56 is further rotated handle 40 is tightly secured to main body 12.

Figure 4:
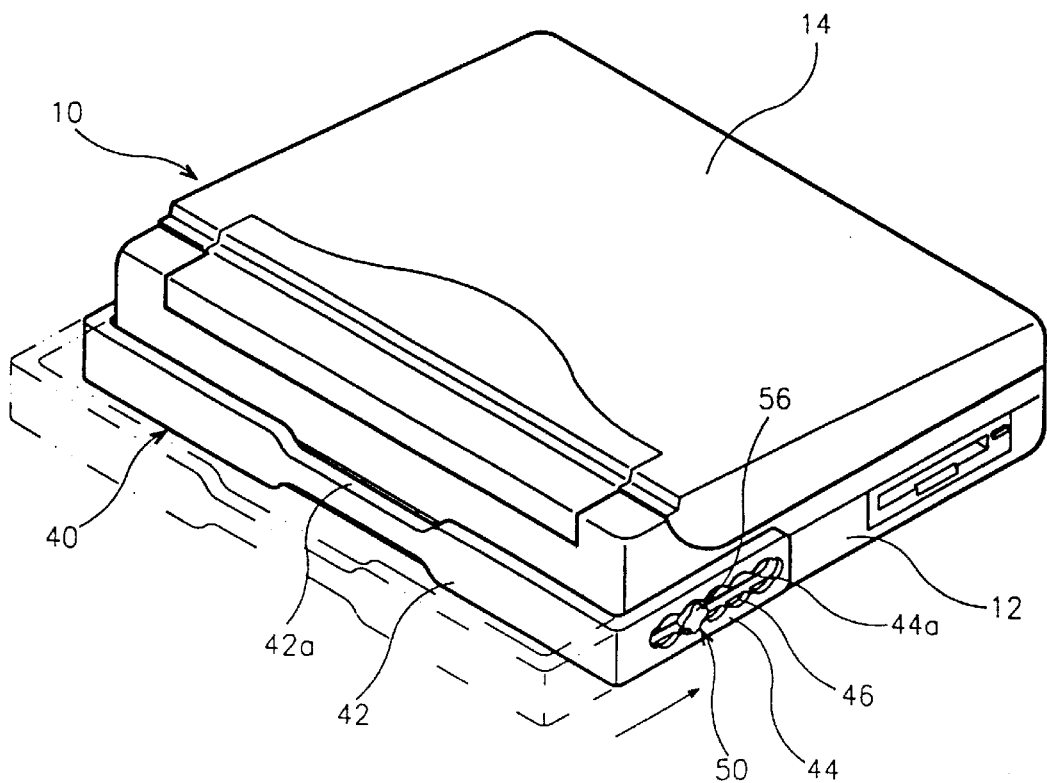
FIG. 4 is a perspective view of the multifunctional handle in an oriented for carrying the portable computer.

The construction of the preferred embodiment allows handle 40 to slide along the sides of main body 12 as well as pivoting upon shaft 52 until flange 58 of fastener 50 is aligned with one of a plurality of grooves 46 and fitted into a pair of oppositely aligned grooves. Furthermore, as shown in FIG. 4, the circumferential member of handle 40 can be adjusted by aligning threaded hole 62 with a positioning groove 46 and then securing the two with fastener 50. Thus, when the handle 40 is in a position parallel with the base of the portable computer and the circumferential member is extended away from the main body, as shown in the imaginary line, the multifunctional handle is ready for carrying the portable computer.

Figure 5:
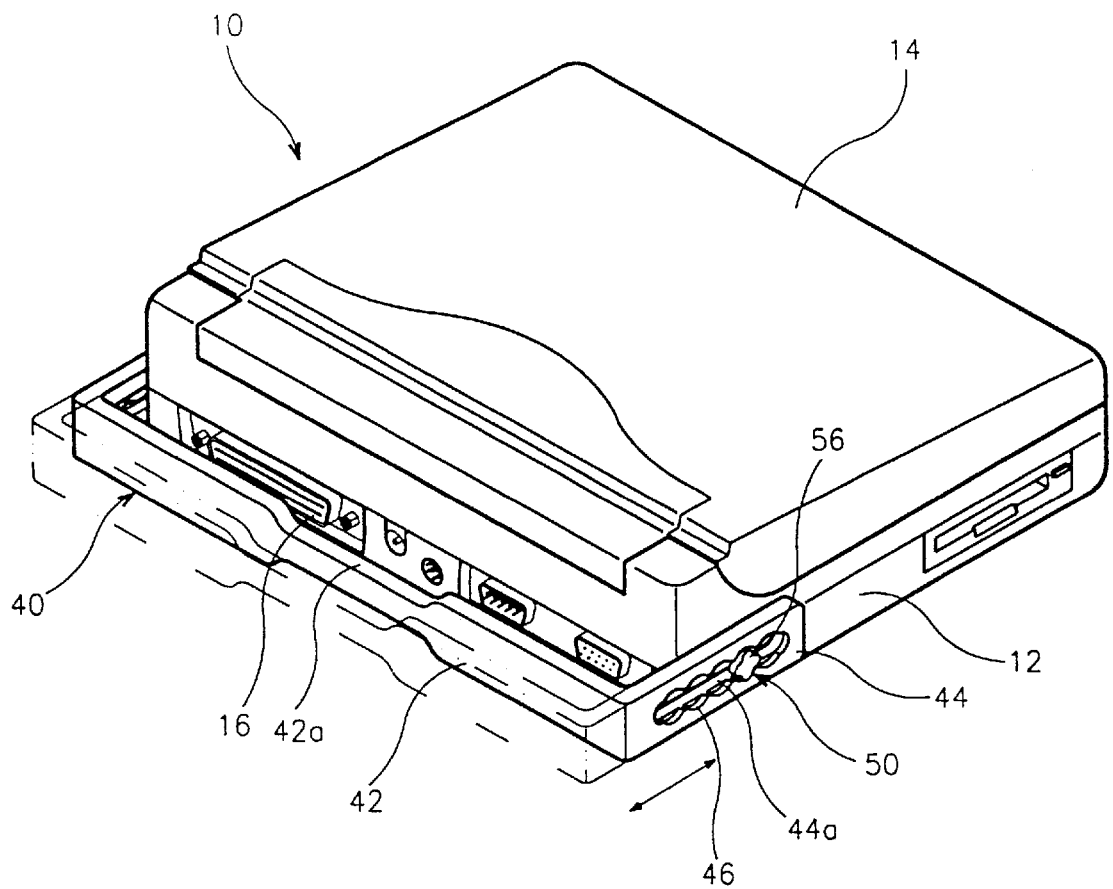
FIG. 5 is a perspective view of the multifunctional handle being positioned to cover the rear ports of the portable computer.

When the handle is parallel with the base of main body and circumferential member 42 is in contact with main body 12, i.e. the handle is in the fully retraction position, I/O ports and connectors 16 located on the rear side of the main body are covered by handle 40. Thus, as shown in FIG. 5, multifunctional handle 40 can also serve as a rear port cover for the portable computer.

Figure 6:
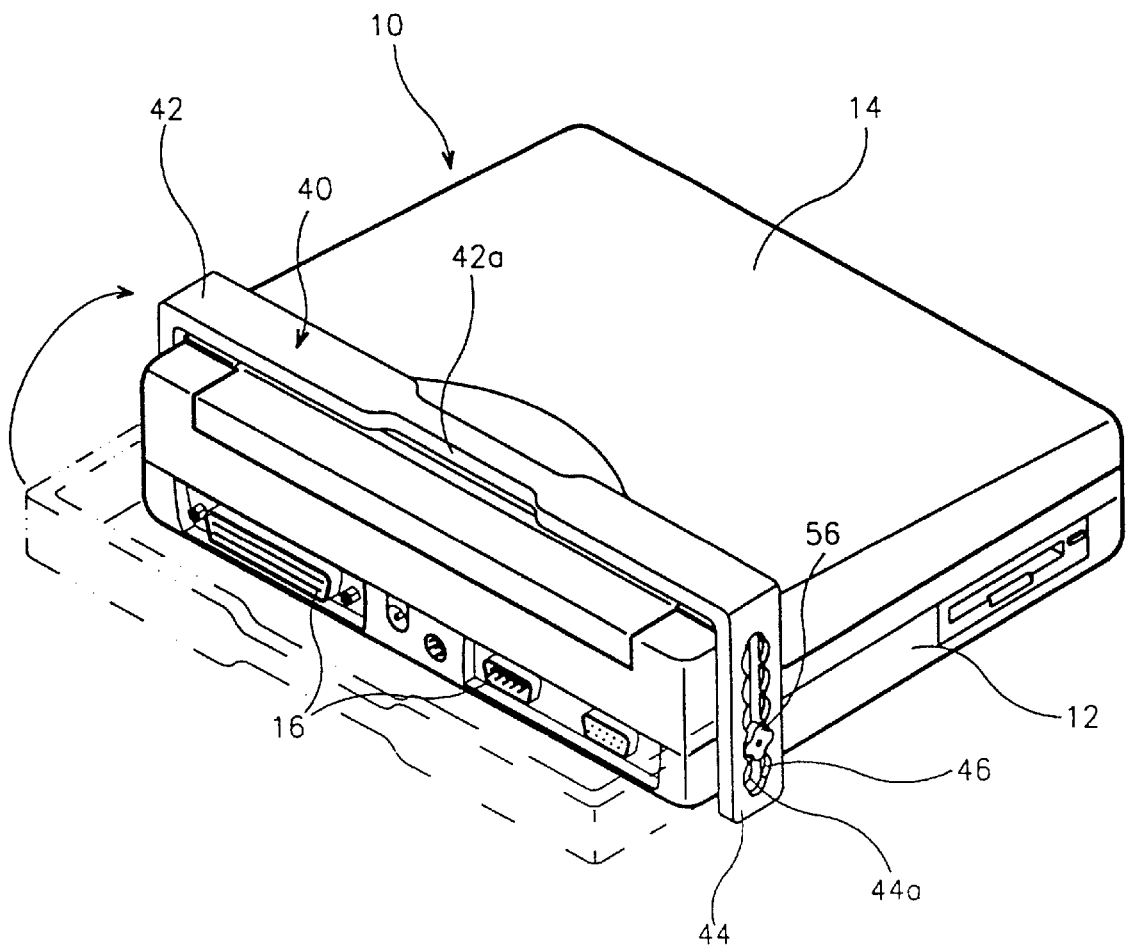
FIG. 6 is a perspective view of the multifunctional handle oriented to function as a lid-locking device.

As shown in FIG. 6, multifunctional handle 40 can also serve as a lid-locking device. To position the handle, fastener 50 is removed and handle 40 pivoted and extended until the circumferential member is located over the cover of the portable computer. Then the handle slides along shaft 52 bringing circumferential member 42 into contact with the cover and fastener 50 secures the lid in a closed position.

Figure 7:
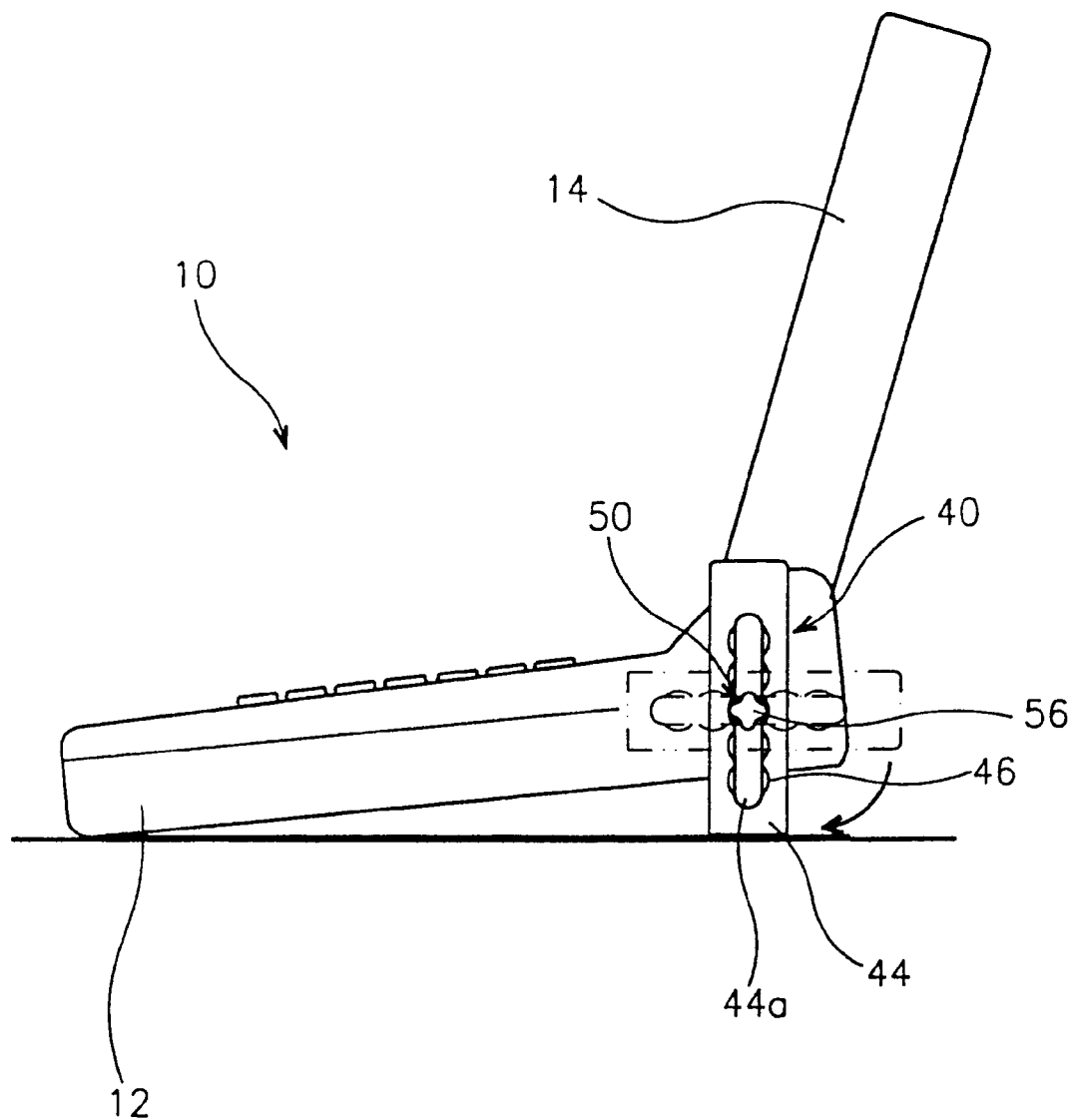
FIG. 7 is a perspective view of the multifunctional handle oriented to function as a tilting device for the portable computer.

Also, when the tilting of the portable computer is desired to facilitate the manipulation of the keyboard, handle 40 can be rotated until the outer surface of circumferential member 42 is below the base of the portable computer. As shown in FIG. 7, once the handle is at an angle that provides the desired amount of tilting, fastener 50 are inserted through guide slots 44a and into threaded holes 62.

As the foregoing makes apparent, multifunctional handle 40 can also serve as a rear port cover, a display panel locking device and a tilting device for a portable computer. Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A portable computer having a multifunctional handle, comprising:
    a main body having a perforation near a rear distal end of both sides of said portable computer, said perforation on both sides being coaxially aligned;

a cover pivotally attached to said main body for containing means for displaying visual images;

said multifunctional handle having two radial members and one circumferential member, each radial member having a guide slot;

a plurality of grooves oppositely positioned from each other along an outer surface of said guide slot in said radial members and having a semi-circular shape;

a fastener insertable through said guide slot, engagable with said perforation in said main body, and matable with said grooves along said guide slot; and said multifunctional handle being positionable and being securable over said cover of said portable computer to form a lid-locking device.

2. The portable computer of claim 1, further comprised of said perforation being cylindrical, threaded, and having a plurality of connected slots to accommodate a plurality of projections on a distal end of said fastener.

3. The portable computer of claim 1, further comprised of said fastener comprising:

a shaft having a threaded middle portion;

a flange attached on a distal end of said shaft, said flange matable with said grooves on said guide slot;

a knob attached to said flange and axially aligned with said shaft, said knob having a knurled outer surface; and a plurality of protrusions on said fastener at a distal end opposite to said flange.

4. The portable computer of claim 1, further comprised of said circumferential member having a grip formed in a middle portion.

5. The portable computer of claim 1, further comprised of said multifunctional handle being positionable and being securable over a plurality of ports on a rear side of said main body to serve as a port covering device.

6. The portable computer of claim 1, further comprised of said multi functional handle being positionable and being securable under a base of said portable computer at a plurality of angles to serve as a tilting device.

7. A portable computer having a multifunctional handle, comprising:

a main body having a perforation near a rear distal end of both sides of said portable computer, said perforation on both sides being coaxially aligned, cylindrical, threaded, and having a plurality of connected slots to accommodate a plurality of projections on a distal end of a fastener;

a cover pivotally attached to said main body for containing means for displaying visual images;

said multifunctional handle having two radial members and one circumferential member, each radial member having a guide slot;

a plurality of grooves oppositely positioned from each other along an outer surface of said guide slot in said radial members and having a semi-circular shape; and said fastener insertable through said guide slot, engagable with said perforation in said main body, and matable with said grooves along said guide slot; and said multifunctional handle being positionable and being securable over said cover of said portable computer to form a lid-locking device.

8. The portable computer of claim 7, further comprised of said fastener comprising:

a shaft having a threaded middle portion;

a flange attached on a distal end of said shaft, said flange matable with said grooves on said guide slot;

a knob attached to said flange and axially aligned with said shaft, said knob having a knurled outer surface; and a plurality of protrusions on said fastener at a distal end opposite to said flange.

9. The portable computer of claim 7, further comprised of said circumferential member having a grip formed in a middle portion.

10. The portable computer of claim 7, further comprised of said multifunctional handle being positionable and being securable over a plurality of ports on a rear side of said main body to serve as a port covering device.

11. The portable computer of claim 7, further comprised of said multifunctional handle being positionable and being securable under a base of said portable computer at a plurality of angles to serve as a tilting device.

12. A portable computer having a multifunctional handle, comprising:

a main body having a perforation near a rear distal end of both sides of said portable computer, said perforation on both sides being coaxially aligned, cylindrical, threaded, and having a plurality of connected slots to accommodate a plurality of projections on a distal end of a fastener;

a cover pivotally attached to said main body for containing means for displaying visual images;

said multifunctional handle having two radial members and one circumferential member, each radial member having a guide slot;

a plurality of grooves oppositely positioned from each other along an outer surface of said guide slot in said radial members and having a semi-circular shape;

said fastener comprising:

a shaft having a threaded middle portion;

a flange attached on a distal end of said shaft, said flange matable with said grooves on said guide slot;

a knob attached to said flange and axially aligned with said shaft, said knob having a knurled outer surface; and a plurality of protrusions on said fastener at a distal end opposite to said flange, said fastener insertable through said guide slot, engagable with said perforation in said main body, and matable with said grooves along said guide slot; and said multifunctional handle being positionable and being securable over said cover of said portable computer to form a lid-locking device.

13. The portable computer of claim 12, further comprised of said circumferential member having a grip formed in a middle portion.

14. The portable computer of claim 12, further comprised of said multifunctional handle being positionable and being securable over a plurality of ports on a rear side of said main body to serve as a port covering device.

15. The portable computer of claim 12, further comprised of said multifunctional handle being positionable and being securable under a base of said portable computer at a plurality of angles to serve as a tilting device.

16. A portable computer having a multifunctional handle, comprising:

a main body capable of receivably engaging said multifunctional handle;

a cover pivotally attached to said main body containing means for displaying visual images;

said multifunctional handle being pivotally engageable and being slidably engageable with said main body; and said multifunctional handle being positionable and being securable over said cover of said portable computer to form a lid-locking device, said multifunctional handle being positionable and being securable over a plurality of ports on a rear side of said main body to serve as a port covering device, said multifunctional handle being positionable and being securable under a base of said portable computer at a plurality of angles to serve as a tilting device.

* * * * *

UNITED STATES PATENT AND TRADEMARK OFFICE
CERTIFICATE OF CORRECTION

PATENT NO. : 6,115,883  
APPLICATION NO. : 08/951840  
DATED : September 12, 2000  
INVENTOR(S) : Kun-Ho Um Page 1 of 1

It is certified that error appears in the above-identified patent and that said Letters Patent is hereby corrected as shown below:

On the title page; should read;

-- (30) Foreign Application Priority Data
October 17, 1996 (KR) ..... 1996-46524 --

Signed and Sealed this

Sixth Day of November, 2007

JON W. DUDAS  
*Director of the United States Patent and Trademark Office*